(12) United States Patent
Maier et al.

(10) Patent No.: US 8,907,661 B2
(45) Date of Patent: Dec. 9, 2014

(54) INPUT APPARATUS WITH HAPTIC FEEDBACK

(75) Inventors: Ferdinand Maier, Neumarkt am Wallersee (AT); Thomas Fischer, Bayerisch Gmain (DE)

(73) Assignee: FM Marketing GmbH, Neumarkt am Wallersee (AT)

( * ) Notice: Subject to any disclaimer, the term of this patent is extended or adjusted under 35 U.S.C. 154(b) by 160 days.

(21) Appl. No.: 13/582,006

(22) PCT Filed: Mar. 22, 2011

(86) PCT No.: PCT/EP2011/001410
§ 371 (c)(1),
(2), (4) Date: Aug. 30, 2012

(87) PCT Pub. No.: WO2011/116929
PCT Pub. Date: Sep. 29, 2011

(65) Prior Publication Data
US 2013/0002341 A1    Jan. 3, 2013

(30) Foreign Application Priority Data

Mar. 22, 2010  (DE) .......................... 10 2010 012 247
May 5, 2010    (DE) .......................... 10 2010 019 596

(51) Int. Cl.
G01B 7/14     (2006.01)
G01B 7/30     (2006.01)
G06F 3/0354   (2013.01)
G06F 3/0362   (2013.01)
H03K 17/97    (2006.01)

(52) U.S. Cl.
CPC .......... *G06F 3/03548* (2013.01); *G06F 3/0362* (2013.01); *H03K 17/97* (2013.01)

USPC ............ 324/207.15; 324/207.11; 324/207.25

(58) Field of Classification Search
USPC ..................................... 324/207.15
See application file for complete search history.

(56) References Cited

U.S. PATENT DOCUMENTS

2002/0093328 A1*  7/2002  Maatta et al. ............ 324/207.11
2008/0238650 A1  10/2008  Riihimaki et al.

FOREIGN PATENT DOCUMENTS

EP  1223541  7/2002
EP  1385081  1/2004
EP  1832964  9/2007

OTHER PUBLICATIONS

International Search Report, PCT/EP2011/001410, dated Jun. 21, 2011, 4 pages.
Written Opinion, PCT/EP2011/001410, dated Jun. 21, 2011, 8 pages.
International Preliminary Report on Patentability, PCT/EP2011/001410, dated Sep. 25, 2012, 12 pages.

* cited by examiner

*Primary Examiner* — Bot Ledynh
(74) *Attorney, Agent, or Firm* — Senniger Powers LLP

(57) ABSTRACT

The input device has a printed circuit board (5) to which a plurality of coils (L1-L8) has been fitted which, together with a capacitor (C2), each form a frequency-determining element of an oscillator (1). The coils (L1-L8) are arranged so as to be distributed along a path (K), which may also be a circular path. A movable magnet portion (M) can be displaced relative to the printed circuit board (5). At least one further stationary magnet portion (M1-M8) is mounted on the printed circuit board (5), which is opposite the movable magnet portion (M).

19 Claims, 13 Drawing Sheets

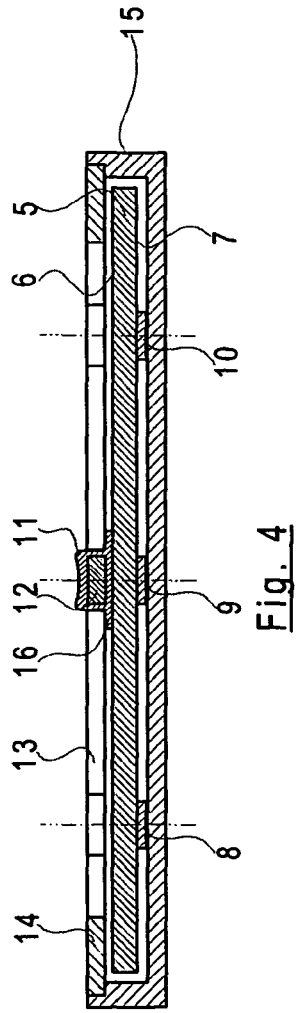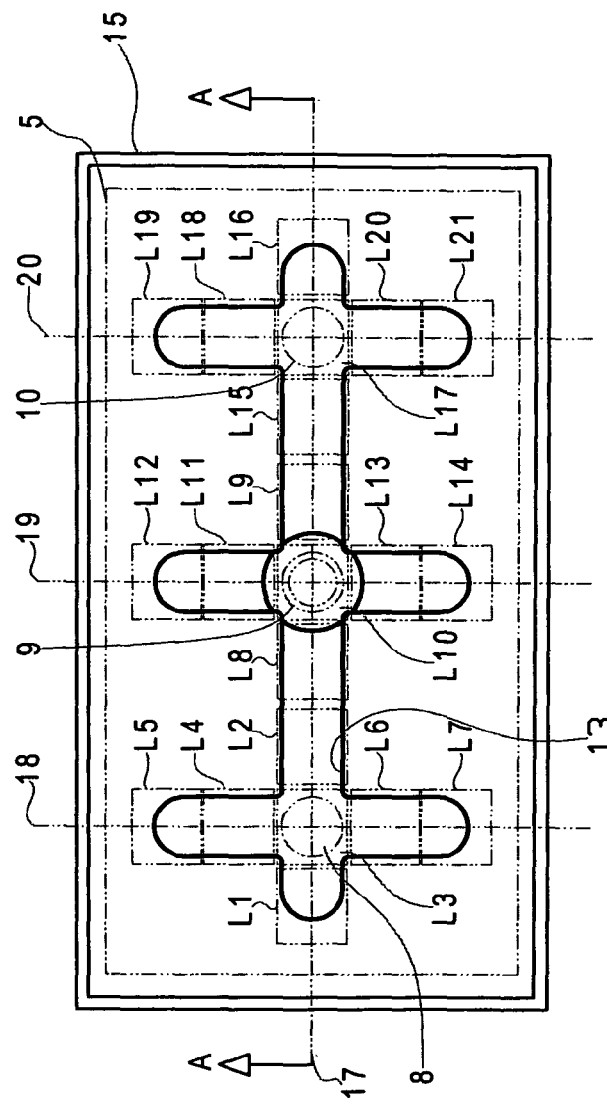

INPUT APPARATUS WITH HAPTIC FEEDBACK

REFERENCE TO RELATED APPLICATIONS

This application is a U.S. national stage application of International Patent Application No. PCT/EP2011/001410, filed Mar. 22, 2011, and claims the benefit of German Application No. 10 2010 012 247.5, filed Mar. 22, 2010 and German Application No. 10 2010 019 596.0, filed May 5, 2010, the entire disclosures of which are incorporated herein by reference.

FIELD OF THE INVENTION

The invention relates to an input apparatus with haptic feedback.

BACKGROUND OF THE INVENTION

Many devices or objects of daily life are operated today by input apparatus such as for example electric switches, control levers, touchscreens, slide controls, keyboards and the like where feedback occurs via other sensory organs than the input. If, for example, a cursor on a monitor shall be controlled by a so-called mouse, input occurs by manual movement of the mouse whereas feedback occurs visually by viewing the monitor. If the volume of a radio shall be modified, today in many units a key is only held down, with the duration of pressing determining the degree of volume change. Here, the feedback occurs acoustically.

It is desirable to receive a direct haptic feedback on tactile entry, with tactile entry (force, displacement, direction) being available for haptic experience directly and not occurring only by a possibly time-delayed system, such as for example via a signal not directly associated with the entry.

Magnetically positioned input devices are suitable for this.

EP 1 223 541 B1 describes an input apparatus in the form of a remote control, in which for control of a cursor on a display screen a movable, adjustable portion with a first magnet mounted on it is displaced relative to a second stationary magnet and the resulting magnet field is measured by means of Hall sensors from which the position of the movable, adjustable portion can be determined. Due to the interaction of the two magnets, the adjustable portion in the absence of external forces is put into a predetermined position. Only by external force, for example by a finger of an operator, the adjustable portion can be displaced out of this rest position, with the force required for displacement being dependent on the position of the magnets to each other, so that the user receives a tactile or haptic feedback.

A third stationary magnet may also be provided so that the adjustable portion can be displaced between two rest positions, with displacement out of both rest positions each requiring an external force.

Further examples of input apparatus with magnets are known from the following documents:

DE 10117956 B4, DE 102005018275 A1,
DE 102007002189 A1, DE 202005019271 U1,
EP 0810544 A2, EP 1901005 A2,
JP 06318134 A, JP 2005004365 A,
U.S. Pat. No. 5,504,502 A, U.S. Pat. No. 7,187,360 B2,
U.S. Pat. No. 7,489,296 B2, U.S. 2002/0054012 A1,
U.S. 2002/0125977 A1, U.S. 2004/0252104 A1,
U.S. 2005/0068134 A1, U.S. 2006/0209019 A1,
WO 03/054782 A1, WO 2006/130723 A2,
WO 2006/131520 A1 and WO 2008/016386 A2.

Most of the above mentioned documents use Hall sensors, which measure magnetic flux density, from which a signal for the position of the movable magnet can be derived.

WO 00/70438 points out that the Hall sensors are quite expensive and can only measure magnetic flux density so that for detecting a direction of displacement of a magnet at least two Hall sensors are required. This document therefore suggests to use coils as sensors. If a magnet is displaced relative to the coil, voltage is induced in the coil, with a voltage impulse also permitting detection of the direction of motion since the voltage impulse depending on the direction of motion starts with a rising or falling edge.

Disadvantageous in this apparatus, however, is that only a displacement can be detected and no static condition.

U.S. Pat. No. 5,698,976 A describes an input device with a board out of magnetic material the surface of which in X and Y direction has a regular but different geometrical configuration in the form of elevations and recesses. A magnet can be displaced relative to said board and a sensor in the form of a coil is displaced together with the magnet. Due to the varying geometry on the board surface, the magnetic flux varies which is detected by the coil.

SUMMARY OF THE INVENTION

It is the object of the present invention to improve the apparatus of the type mentioned above in such a way that with little expenditure it supplies a precise electric signal for the displacement and/or the position of the magnetic movable input device, and at the same time supplies a haptic feedback. Preferably the haptic feedback shall be adjustable. Preferably, also rotations shall be detectable.

This object is realized by the features specified in claim 1. Advantageous embodiments and further developments of the invention are to be taken from the dependent claims.

The basic principle of the invention is that coils printed onto a printed circuit board are used as sensors, the inductance of which is part of an inductive/capacitive oscillating circuit. The value of inductance changes as a function of the relative position of a magnet portion to the coil and/or the coils so that the oscillation frequency of the oscillating circuit changes as a function of the position of the magnet portion.

By this, on the one hand one gets a static signal by which the position of the magnet portion relative to the coil(s) can be evaluated at any time but also the speed of displacement of the magnet portion due to modification of the oscillation frequency.

It is pointed out here that the terms magnet and counter magnet have to be understood such that both parts can be magnetized and therefore each form a permanent magnet as well as the case that only one of the two is a permanent magnet whereas the other is comprised of ferromagnetic material but not permanently magnetized material. Therefore, it is more generally referred to "magnet portion" and/or "magnet portions". Instead of permanent magnets, solenoids can be used as well.

For arrangement of the magnet portions and the coils, different alternatives are provided for by the invention. In one embodiment, a movable magnet is arranged on one side of the printed circuit board whereas one or more stationary magnets are arranged on the opposite side of the printed circuit board. But arrangement of all magnets on one side of the printed circuit board is possible as well. As movable magnets, disc magnets, annular, ball-shaped or cylindrical magnets can be considered with it being also possible that a ball be inserted into the movable magnet to reduce friction which balls protrude only slightly from the magnet lower face so that no sensible tilting of the magnet occurs.

As stationary magnets, the types of magnets mentioned can be considered as well, such as disc magnets as well as an annular magnet, an annular magnet with central magnet as well as several magnets arranged in predetermined patterns.

For adjustment of haptic feedback, also solenoids can be used, the energizing current of which is regulated, whereby the forces occurring between the solenoid and the movable magnets are adjustable.

The coils serving as sensors can be fitted to the printed circuit board in various patterns, and, for example, be printed or produced by means of lithography or other known methods, with it being possible that several coils can be fitted in several patterns, such as for example in a matrix, which are associated with each other in lines and columns.

Due to the arrangement of several magnets, different scanning positions are created, whereby, for example, different menu levels can be called, or different operating functions.

The invention is suitable for all fields of applications in which by displacement of an operating element functions are to be controlled such as for example remote controls, mouse substitutes for computers, operation of functions in motor vehicles and operation of all imaginable, electrically controllable machines.

Signal transmission from the input apparatus to devices to be controlled can be made via infrared, cable, ultrasound.

It is desirable to detect not only linear movements in a plane by haptic feedback but also rotations.

According to a further development of the invention, at least some of the sensors are therefore arranged so as to be distributed along a circular path and are preferably in equidistant space to each other. Likewise arranged so as to be distributed along the circular path are counter magnets or ferromagnetic metal parts, which in co-operation with the magnet moving along the circular path provide haptic feedback, and define "locking positions" for a rotatable operating element to which the movable magnet is fitted.

By arrangement of several stationary or movable magnet portions, different scanning positions are created, so that, for example, different menu levels can be called, or different operating functions.

BRIEF DESCRIPTION OF THE DRAWINGS

Further details and advantages of the invention result from the following description of various embodiments of the invention which are explained more in detail in connection with the drawing where

FIG. 3 is a top view of the input device according to an embodiment of the invention;

FIG. 4 is a longitudinal section along line A-A of FIG. 3;

DETAILED DESCRIPTION OF PREFERRED EMBODIMENTS OF THE INVENTION

Figure 1:
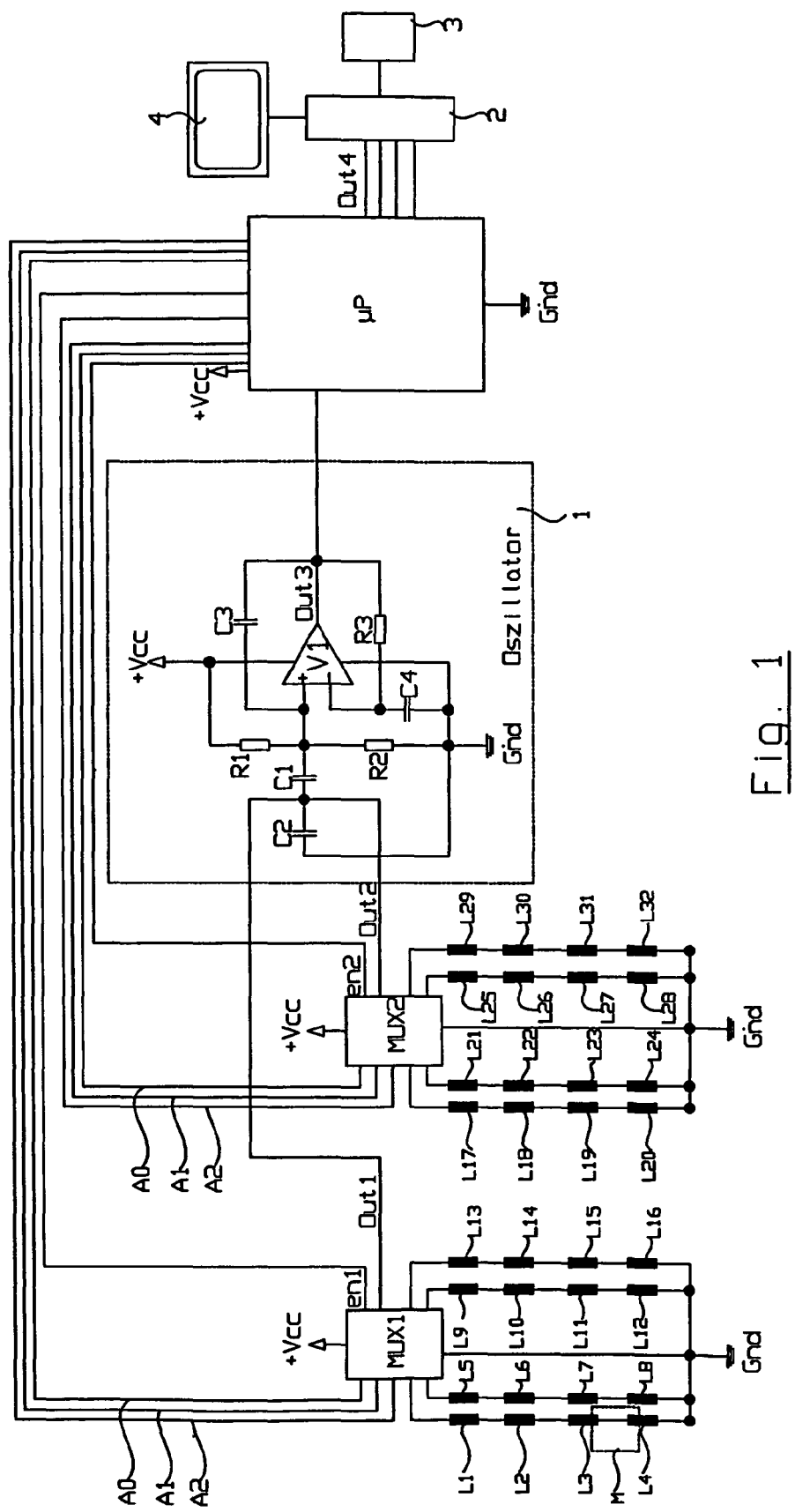
FIG. 1 is a circuit diagram of the inventive device according to a first embodiment.

The circuit diagram of FIG. 1 shows 8 rows of inductors L1 to L32 connected in series, each individual inductor shown representing a coil which serves as a sensor for the position of a magnet M. The rows of inductors L1 to L16 are connected to a first multiplexer MUX1 and the rows of inductors L17 to L32 to a second multiplexer MUX2. Multiplexers MUX1 and MUX2 are activated by a microprocessor µP chronologically one after the other via Enable inputs EN1 and EN2, with individual inputs of the multiplexers being selected via address lines A0, A1 and/or A2, and switched through to their respective outputs OUT1 and/or OUT2. Outputs OUT1 and OUT2 of multiplexers MUX1 and MUX2 are fed to an oscillator 1 which is designed here as follows:

An operational amplifier V1 with its positive input (+) is connected to a voltage divider of resistors R1 and R2 located between supply voltage +Vcc and ground (Gnd), with the common junction of resistors R1 and R2 being connected to the two outputs OUT1 and OUT2 via a first capacitor C1. Said junction is connected to ground via a second capacitor C2. Moreover, the positive input of the operational amplifier V1 is connected to the output of operational amplifier V1 via a feedback capacitor C3. The negative input of the operational amplifier is connected to the output of operational amplifier V1 via a resistor R3 and to ground via a capacitor C4.

When an input of one of the multiplexers is connected through, the selected row of inductors L1 to L32 and the capacitor C2 are thus in parallel connection between ground and the positive input of the operational amplifier V1, and thus form an LC element of an oscillating circuit and/or oscillator completed by the operational amplifier, with said LC element being connected to the positive input of the operational amplifier V1 via the coupling capacitor C1.

Thus, a signal appears on the output OUT3 of the operational amplifier V1, the frequency of which is subject to the respective values of the LC element. The inductance value of the rows of inductors L1 to L32 is modified by a metal part, such as e.g. a magnet M, placed near the coils forming the inductors, so that finally the frequency of the signal emitted at output OUT3 is subject to the relative position between a magnet M and coils L1 to L32.

The output signal at output OUT3 is fed to the microprocessor µP, evaluated there and, depending on the application, emitted as a control signal at an output OUT4.

Output OUT4 of the microprocessor µP may be a serial or parallel digital output or an analog output which, depending on the intended use, is fed to driver circuits 2 and/or actuators 3 and, if applicable, a display 4.

The microprocessor μP can evaluate not only the frequency but also the temporal change of the frequency, and thus not only output a signal, which characterizes the relative position of magnet M to the individual coils L1 to L32 but also its motion speed.

Depending on the motion speed, representation on the display can also be shown in a delayed or accelerated way, resulting in the additional interesting effect that the subjective perception of the user regarding haptic feedback of the force of the magnet is changed by the rate of change of the representation on the display. Because it has been found that haptic perception is influenced by an additional visual representation. This function is realized by a software in the microprocessor.

Figure 2:
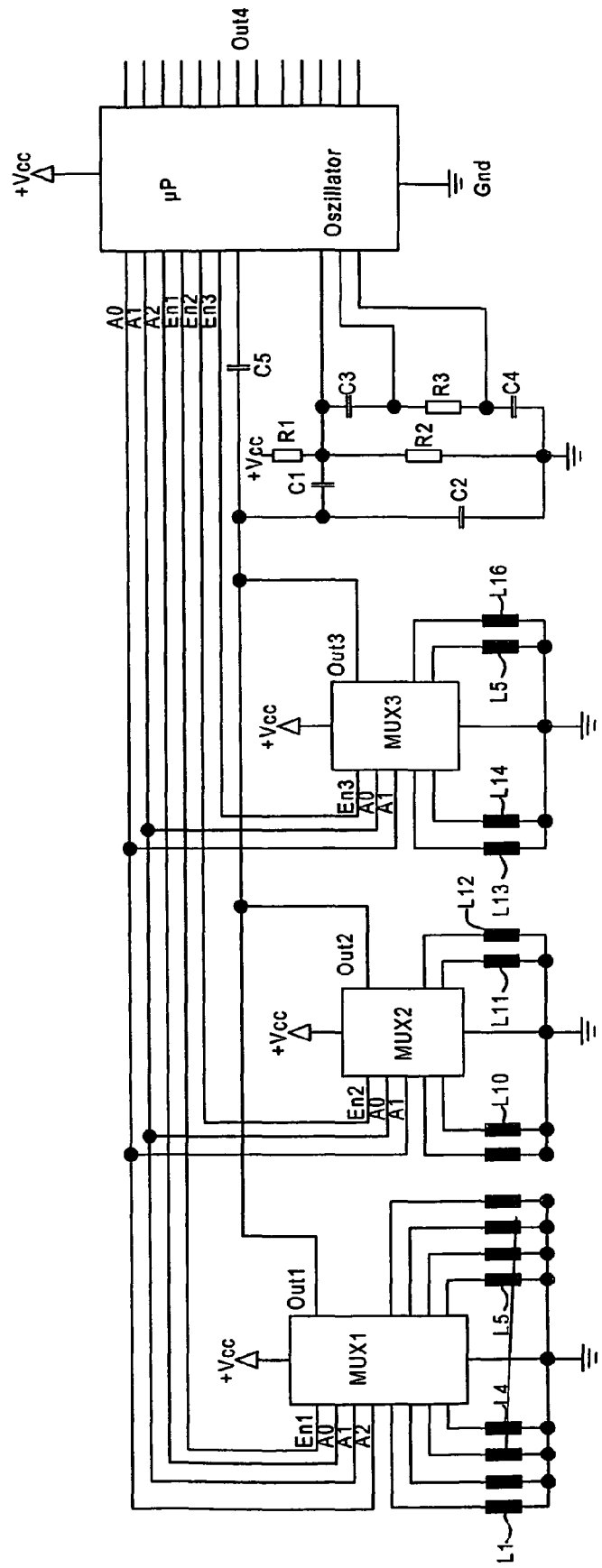
FIG. 2 is a circuit diagram according to a second embodiment of the invention.
Figure 5:
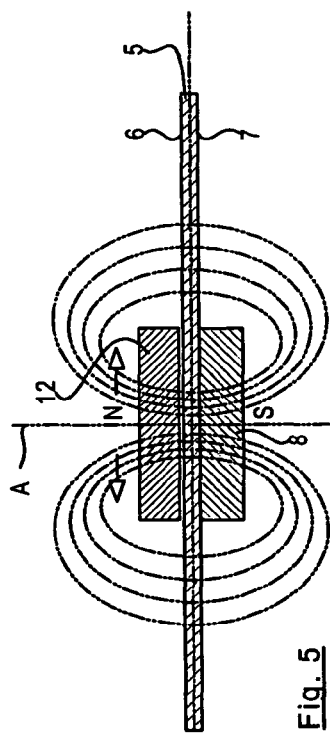
FIGS. 5 to 10 are schematic diagrams of different arrangements of magnets which can be used in the invention.

The circuit of FIG. 2 differs from that of FIG. 1 in that three multiplexers MUX1, MUX2 and MUX3 are connected to the microprocessor μP, that the operational amplifier V1 of the oscillator 1 is integrated into the microprocessor μP, that the modules connected to the output of the microprocessor have been omitted, and that finally only one inductor each is connected to each input of the multiplexers.

The multiplexer MUX1 is here a ⅛ multiplexer whereas the multiplexer MUX2 and MUX3 are ¼ multiplexers. Of course, other types of multiplexers are possible. Accordingly, multiplexer MUX1 also needs one address line more than the multiplexers MUX2 and MUX3. The external wiring of the operational amplifier integrated into the microprocessor with the resistors R1 to R3 and the capacitors C1 to C4 corresponds to FIG. 1. In addition, the microprocessor μP has still another sensor input which is connected to the outputs OUT1, OUT2 and OUT3 of the multiplexers via a capacitor C5. Said capacitor C5 serves for ensuring initial oscillation of the oscillator during switchover of the multiplexers.

In connection with FIGS. 1 and 2 it has to be stated that the number of inductors as well as the number of multiplexers is optional, and shall be adapted to the intended purpose in each case.

FIGS. 3 and 4 show an embodiment of an input apparatus with a printed circuit board 5 onto the upper surface 6 of which coils (not shown) are printed. This side be designated as upper side 6. On the opposite lower face 7 three permanent magnets 8, 9 and 10 are fitted here, for example glued on. On the upper side 6, a movable operating element 11 with another permanent magnet 12 is located displaceably in a sliding block guide 13, with the sliding block guide 13 being formed in a plate 14 by corresponding recesses, which at the same time defines an end of a housing 15 into which the printed circuit board 5 is inserted. The operating element 11 has an annular projection 16 on the side facing towards the printed circuit board 5, the diameter of which is greater than the opening width of the sliding block guide 13 so that the operating element 11 together with the magnet 12 is protected against falling out.

The three magnets 8, 9 and 10 are arranged here along a straight line 17, and thus determine three rest positions for the movable magnet 12 which is shown here in rest position at the central permanent magnet 9. From the respective rest position the magnet 12 can be displaced not only in X direction along the line 17 but also in an Y direction perpendicular to it along lines 18, 19 or 20.

In FIG. 3, several coils L1 to L20 printed onto the printed circuit board 5 are indicated as rectangles shown with dashed lines which are interconnected in a circuit pursuant to FIG. 1 or 2. The operating element 11 with the magnets 12 can be displaced along the sliding block guide 13, with the circuit then detecting the precise position of the magnet.

With an apparatus pursuant to FIGS. 3 and 4 a plurality of devices can be controlled. If the displaceable magnet 12 is displaced into the rest position at one of the magnets 8, 9 or 10, thus, e.g., a specific submenu can be called such as for example the control system of the windows of a motor vehicle which is described in connection with line 19. If the magnet 12 is shifted to the "left" from the position shown in FIG. 3, the inductor L8 is adjusted, and the left window is selected. If the magnet 12 is shifted to the "right", the inductor L9 is adjusted, and the right window is selected. A shifting to the "top" adjusts the inductors L10 and/or L11, which is interpreted as a command "close window", with the position of the magnet in the direction of the line 19 and/or its displacement relative to magnet 9 determining the speed of closing of the window. Similarly, a displacement of the magnet along the line 19 to the "bottom" leads to the inductors L12 and L13 causing a correspondingly faster or slower closing of the window. The same is valid for other positions of the magnet regarding coils L1 to L7 and L15 to L21.

Temperature control for the left and right vehicle side, for example, can be assigned to the sliding block guide along line 18, and electrical adjustment of the right and left exterior rear-view mirrors to line 20.

Due to the magnetic forces one gets immediately the desired haptic feedback for each function selected. Of course, other arrangements of sliding block guides are possible as well. A particularly simple variant would be a simple cross with X and Y direction by means of which one can move over a matrix-shaped menu field on a display.

FIGS. 5 to 10 show different arrangements of the magnets. In the simplest case of FIG. 5 a disc-shaped permanent magnet 8 is fitted on the lower face 7 of the printed circuit board 5 whereas the movable magnet 12 is disc-shaped as well. It can be displaced freely along the upper side 6 of the printed circuit board 5. Both magnets 8 and 9 are axially magnetized, i.e. in the direction of the axis 21, which is perpendicular to the printed circuit board 5, which is indicated by dashed magnetic field lines.

Figure 6:
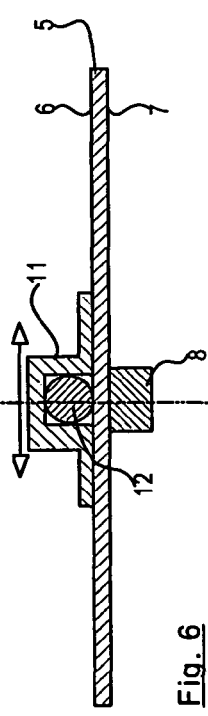

In FIG. 6, the movable magnet 12 is a cylindrical bar magnet which in the case of displacement of the operating element 11 can roll off in the direction of the arrows on the upper side 6 of the printed circuit board 5. The magnet 12 is magnetized in its axial direction. The direction of magnetization of the stationary magnet 8 is then likewise oriented in parallel to the axis of the magnet 12.

Figure 7:
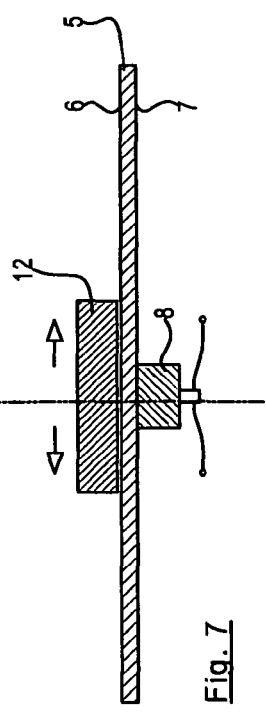

In the embodiment of FIG. 7, the stationary magnet 8 is a solenoid, which is controlled by the microprocessor of FIGS. 1 and 2, if necessary, by an addition driver circuit whereby the force for displacement of the movable permanent magnet 12 is modifiable so that haptic feedback is adjustable, be it to the respective intended use or to individual operators, thus also an adaptive system being realizable.

Figure 8:
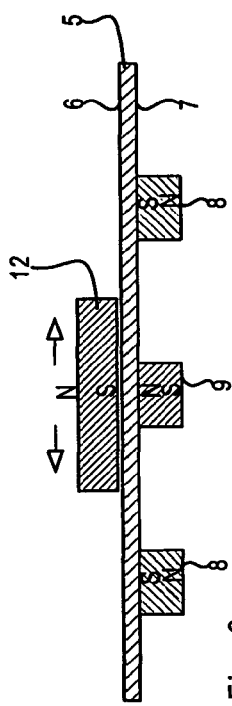

In FIG. 8 two stationary magnets are provided on the lower face 7 of the printed circuit board 5, namely an annular magnet 8, in the center of which a disc-shaped magnet 9 is located.

Figure 9:
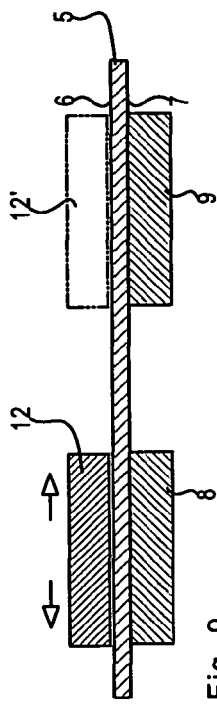

In the embodiment of FIG. 9 likewise two magnets 8 and 9 are fitted on the lower face 7 of the printed circuit board 5, which are disc-shaped here, thus defining two possible rest positions for the movable magnet 12 (and 12').

Figure 10:
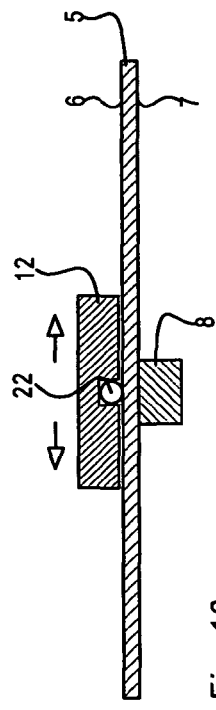

The embodiment of FIG. 10 shows an alternative where the movable magnet 12 has a central recess into which a ball 22 is inserted, which slightly protrudes from the lower face of the magnet 12 opposite to the upper side 6 of the printed circuit board 5 in order to facilitate displacement of the magnet 12. The air gap between the magnet 12 and the upper side 6 of the printed circuit board 5 is so small here that a tilting of the magnet does not affect the measurement result at all.

Figure 12:
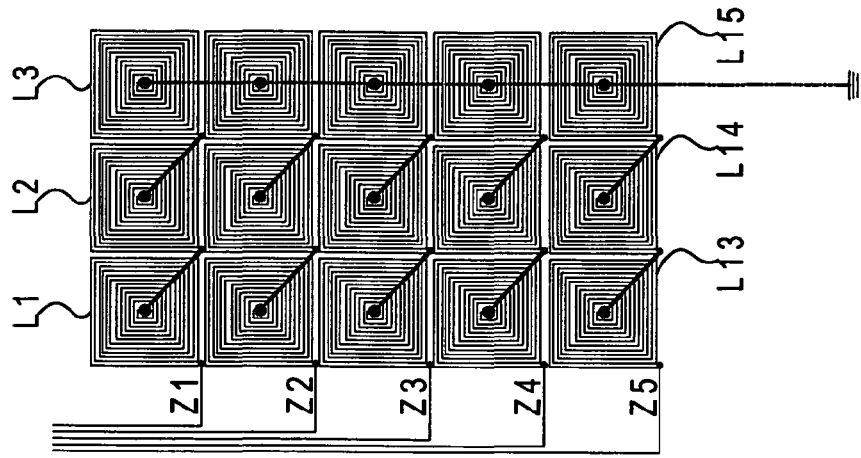
FIG. 12 is a view similar to FIG. 11 according to another embodiment of the invention.
Figure 11:
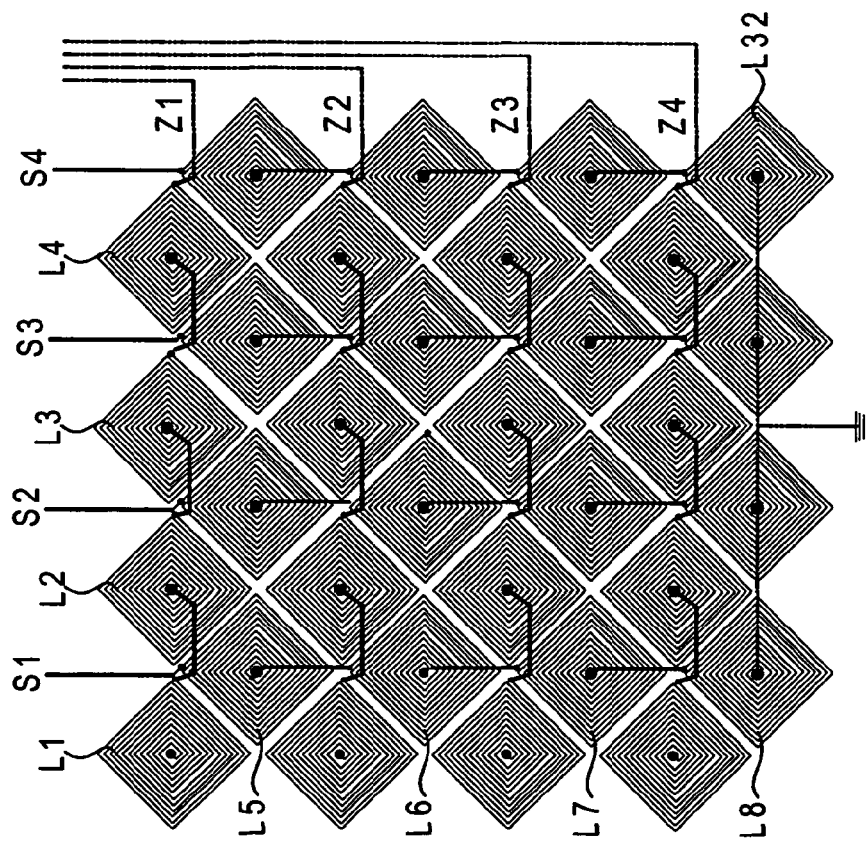
FIG. 11 is a top view of an arrangement of coils used in the invention according to an embodiment of the invention.

FIGS. 11 and 12 show arrangements of coils L1 to L32 which are fitted on the upper side 6 of the printed circuit board 5. The coils of FIG. 11 correspond to the inductors L1 to L32 of FIG. 1. They are connected in series in rows and columns. Thus, the coils L1, L2, L3 and L4 form, for example, the coils of a first line Z1 whereas the coils L5, L6, L7 and L8 form the coils of a first column S1.

The electrical connection of the coils occurs via feedthroughs on the lower face of the printed circuit board. The corresponding line connections are illustrated by bolder lines. The respective movable magnet is displaced over the surface formed by the matrix of the coils with the position of the magnet being detectable by polling the lines and columns.

In the embodiment of FIG. 12 the coils are likewise arranged in a matrix but compared with the arrangement of FIG. 11 each rotated by 45°, with the electrical connection being selected such that three coils of a line Z1 to Z5 are always connected in series so that only lines can be polled in each case. Such an arrangement is provided for those cases where the magnet can be displaced only along a straight line.

It should be noted that the coils shown in FIGS. 11 and 12 are illustrated in a significantly magnified manner for a clear and comprehensible representation, and that in practice the side length of a coil is only a few millimeters.

Figure 15:
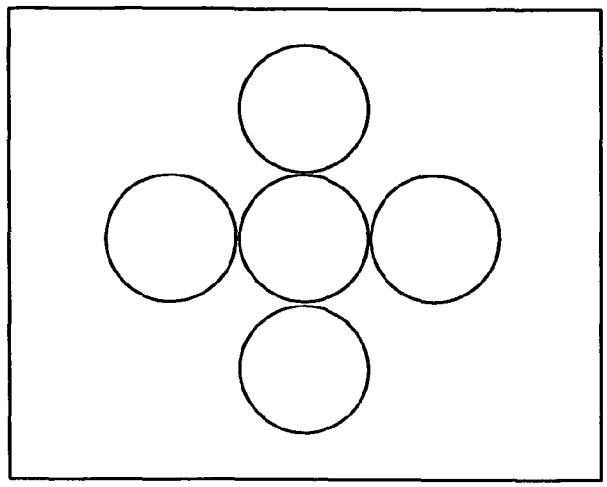
FIGS. 13 to 15 are schematic views of the arrangement of coils which can be used in the invention.
Figure 14:
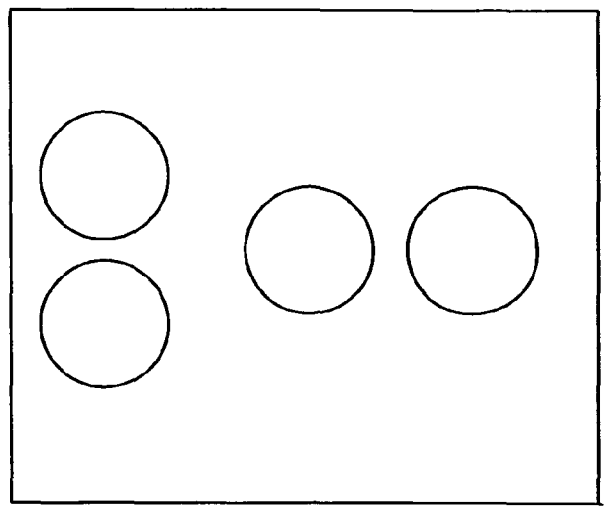
Figure 13:
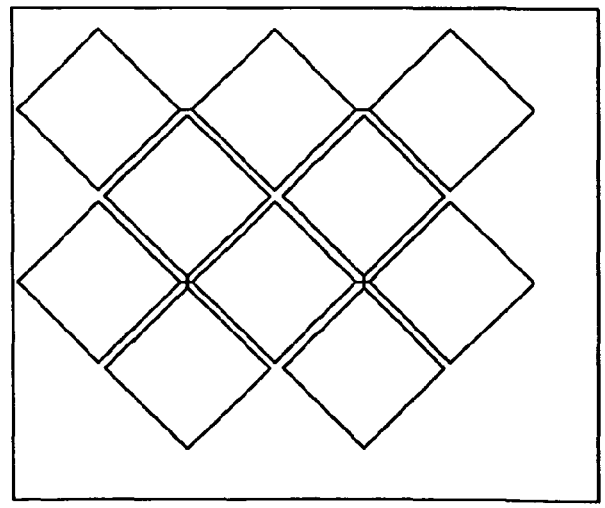

FIGS. 13 to 15 show schematically other patterns for the arrangement of coils on the printed circuit board. In FIG. 13 the coils are arranged diamond-shaped in lines and columns, similarly to the example of FIG. 11, with it having to be noted that the number of coils and/or lines and columns are within the discretion of the person skilled in the art and have to be adapted to the respective intended use. In the example of FIG. 13 two columns with three coils each connected in series and two lines with two coils each connected in series exist. In FIG. 14, the coils are circular and approximately arranged in the form of a T. In FIG. 15, the coils are likewise circular and arranged in the form of a cross.

Additionally, it should be noted that all features shown in FIGS. 1 to 15 can be combined with each other, for example, all arrangements of magnets shown in FIGS. 5 to 10 can be combined with all arrangements of coils shown in FIGS. 11 to 15, and said combination in turn with the circuits of FIGS. 1 and 2.

Figure 16:
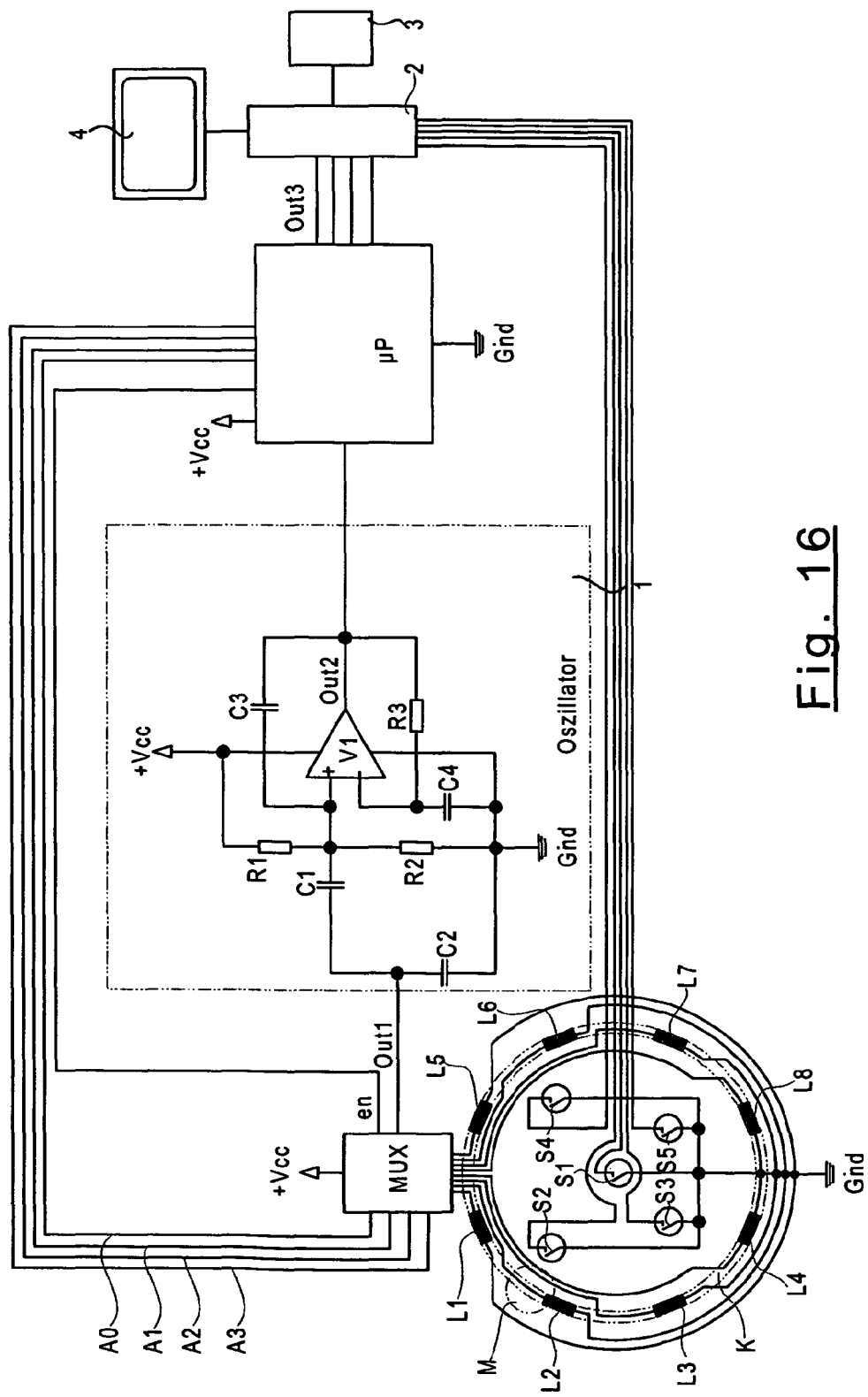
FIG. 16 is a circuit diagram of the input device according to a first embodiment of the invention.

In the circuit diagram of FIG. 16 eight inductors L1 to L8 connected in parallel are shown, with each individual inductor shown representing a coil which serves as a sensor for the position of a magnet portion M. The inductors L1 to L8 are each connected to an input of a multiplexer MUX, and connected to ground (Gnd) with their other end. All inductors are situated on a circular path K and are arranged here in variable distance to each other. In the inner area of the circular path, five electric switches S1 to S5 are located here, the connections of which can optionally be linked with a microprocessor µP or a driver circuit 2.

The multiplexer MUX is activated by a microprocessor µP via an Enable input (en), with individual inputs of the multiplexer being selected via address lines A0, A1, A2 and/or A3, and switched through to its corresponding output OUT1. The output OUT1 of the multiplexer MUX is connected to an oscillator 1 which is designed here as follows:

An operational amplifier V1 (e.g. a comparator) with its positive input (+) is connected to a voltage divider of resistors R1 and R2 located between supply voltage +Vcc and ground (Gnd), with the common junction of resistors R1 and R2 being connected to the output OUT1 of the multiplexer MUX1 via a first capacitor C1. Said junction is connected to the ground via a second capacitor C2. Moreover, the positive input of the operational amplifier V1 is connected to the output OUT2 of the operational amplifier V1 via a feedback capacitor C3. The negative input of the operational amplifier V1 is connected to the output of the operational amplifier V1 via a resistor R3 and to the ground via a capacitor C4.

When an input of one of the multiplexers is connected through, one of the inductors L1 to L8 and the capacitor C2 are thus in parallel connection between the ground and the positive input of the operational amplifier V1, and thus form an LC element of an oscillating circuit completed by the operational amplifier, with said LC element being connected to the positive input of the operational amplifier V1 via the coupling capacitor C1.

Thus, a signal appears on the output OUT2 of the operational amplifier V1, the frequency of which is subject to the respective values of the LC element. The inductance value of the inductors L1 to L8 is modified by a magnetic field, such as e.g. by a metal part, placed near the coils forming the inductors, so that finally the frequency of the signal emitted at output OUT2 is subject to the relative position between the metal part and the coils L1 to L8.

The output signal at output OUT2 is fed to the microprocessor µP, evaluated there with respect to its frequency and, depending on the application, emitted as a control signal at an output OUT3.

Output OUT3 of the microprocessor µP may be a serial or parallel digital output or an analog output which, depending on the intended use, is fed to driver circuits 2 and/or actuators 3 and, if applicable, a display 4.

The microprocessor µP can evaluate not only the frequency but also the temporal change of the frequency, and thus not only emit a signal, which characterizes the relative position of magnet portion M to the individual coils L1 to L8 but also its motion speed.

In connection with FIG. 16 it is to be noted that the number of inductors L1 to L8 as well as the number of multiplexers is optional, and shall be adapted to the intended purpose in each case.

For some applications it is desirable to generate simple switching commands, which merely adopt the states ON or OFF, for example for the control of a cursor on a monitor with the four directions of motion up, down, left and right as well as a confirmation command for a selection which is generated by a so-called OK key. For this purpose, inside the circular path K of FIG. 16 four switches S1 to S5 are located which are here directly connected to the driver circuit 2. It is obvious to the person skilled in the art that the outputs of the switches S1 to S5 can also be fed to the microprocessor µP. In the embodiment shown ground potential is applied to the output of the switches by closing the switches. Of course, it is also possible to connect the switches electrically so that a different potential such as for example positive or negative supply voltage is present at the output.

Figure 17:
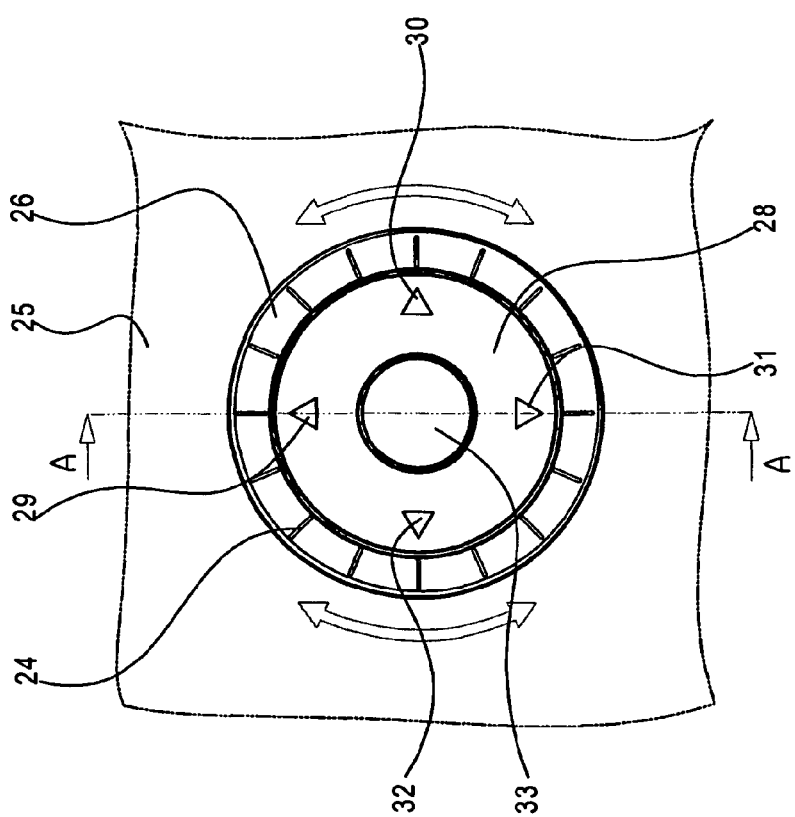
FIG. 17 is a sectional top view of an input device according to an embodiment of the invention.

FIG. 17 is a top view of actuating means of the input apparatus according to the invention. A rotary swivel 26 is embedded into a wall of the housing 15, which comprises a plurality of gripping projections 24 or a different surface structure, and can be rotated by the operator by an axis perpendicular to the plane of projection of FIG. 17. The mechanical design is described more in detail below in connection with FIG. 19. Inside the rotary swivel 26 a so-called cursor ring 28 is arranged, which can be pressed down in the points marked with the arrows 29, 30, 31, 32 of FIG. 17, in order to actuate the switches S2, S3, S4 and/or S5.

Inside the cursor ring 28 a push-button 33 is located by means of which the switch S1 is actuated.

At least one magnet portion is fitted on the rotary swivel 26, which is moved on a circular path K together with the rotary swivel 26, when the rotary swivel 26 is rotated.

Figure 18:
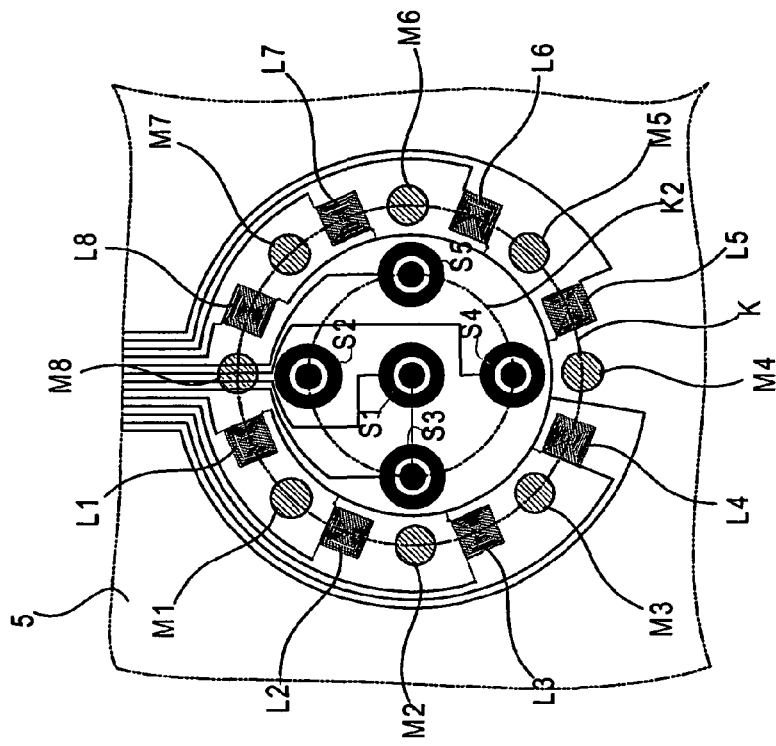
FIG. 18 is a top view of a printed circuit board according to the embodiment of FIG. 17.

In FIG. 18, several coils L1 to L8 printed onto the printed circuit board 5 are indicated as rectangles shown with dashed lines which are interconnected in a circuit pursuant to FIG. 16. The coils L1 to L8 are arranged so as to be distributed along a circular path K in variable distances, with the circular path K being covered by the rotary swivel 26 (FIG. 17). If the rotary swivel 26 is rotated with one or several magnet portions, the magnet portions vary their relative position to the coils L1 to L8, with the circuit of FIG. 16 then detecting the precise position of the magnet portion or magnet portions M.

Several stationary counter magnet portions M1 to M8 are fitted on the printed circuit board 5 which are also arranged so as to be distributed along the circular path K in variable distances, and are located here between adjacent coils L1 to L8. As has already been explained at the beginning, the counter magnet portions can be permanent magnets or ferromagnetic metal parts, with it being possible that the magnet portions M fitted on the rotary swivel 26 are also permanent magnets or ferromagnetic parts, with only one of the magnet portions and/or counter magnet portions requiring to be a permanent magnet.

Finally, the counter magnet portions fitted on the printed circuit board 5 may also be solenoids, the magnetic field of which can be modified by the electric current flowing through the solenoid.

The counter magnets M1 to M8 define "locking positions" for the rotary swivel 26 and in co-operation with the magnet portion M also create a haptically perceivable force on the rotary swivel 26.

Figure 19:
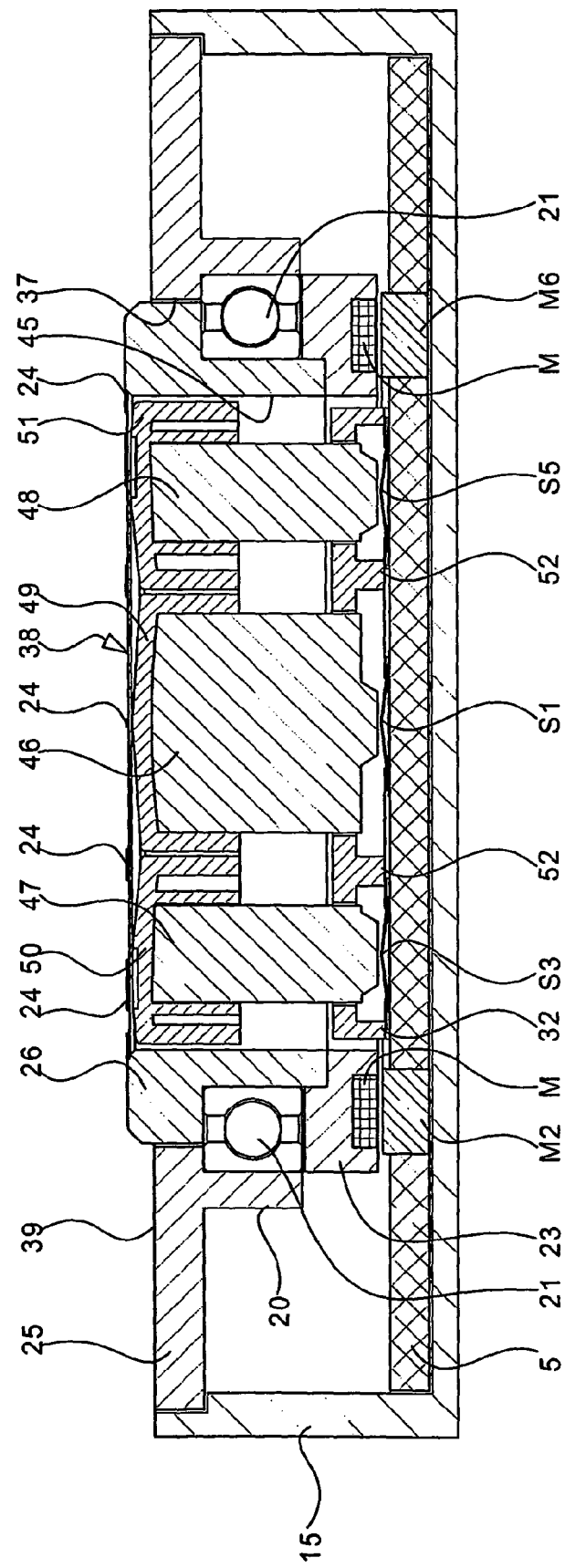
FIG. 19 is a cross-section of the input device according to another embodiment of the invention.

Inside the circular path K, electric switching contacts for the switches S1 to S5 are shown on the printed circuit board 5, which in the embodiment shown are electrically conductive circular rings, and have a counter contact surface in the center of said circular rings, which are electrically connected with each other by a mechanically operable control element (FIG. 19). The switches S2 to S5 are located on an inner circular path K2 which is concentrical to the circular path K. The switch S1 is located in the center of the circular paths. The switching contact surfaces of the switches S1 to S5 and the connections of the sensors L1 to L8 are led to the electric components of FIG. 16, such as for example the multiplexer MUX or the driver circuit 2, via track conductors.

FIG. 19 is a cross-section of the mechanical design of the input device according to one embodiment of the invention.

The printed circuit board 5 is here inserted into a housing 15, the housing cover of which is the housing wall of FIG. 17. In assembled condition, the housing wall is firmly connected with the housing 15. It has a circular opening 37 into which the rotary swivel 26 engages, with the upper side 38 of the rotary swivel 26 projecting beyond the upper side 39 of the housing wall 25. The housing wall 25 has a bearing ring 40 protruding radially towards the inside to which the ball bearing 21 is fitted. The ball bearing 21 inner ring is associated with the rotary swivel 26. Thus, the rotary swivel 26 can be rotated smoothly relative to the housing 15 and the housing wall 25. It is obvious to the person skilled in the art that an alternative without ball bearing is possible as well.

The rotary swivel 26 is here non-rotatably connected with a magnet supporting ring 23 to which one or more magnet portions M are fitted which thus can rotate along the circular path K together with the rotary swivel 26.

Counter magnet portions are embedded here into the printed circuit board 5, with the counter magnet portions M2 and M6 being visible which are likewise located in a circular path. The magnet portion(s) and the counter magnet portions—as mentioned at the beginning—can be configured such that the one or ones of it are magnets whereas the one or the others are metal parts out of ferromagnetic material.

The sensors L1 to L8 are placed adjacent to the counter magnet portions and are not visible in FIG. 19.

The rotary swivel 26 has a central opening 45 for actuating elements of the switches S1 to S5. In FIG. 19, these switches are configured as switch domes of known type which are operated by switch plungers 46, 47 and/or 48. The switch domes can be metal domes, so-called polydomes, or any other known control elements. The switch plungers 46 to 48 are covered with caps 49, 50, 51 which can be pressed down individually in the direction of the printed circuit board 5. The switch plungers 46, 47, 48 are guided in guide means 52, which are connected to the printed circuit board 5 so that they can be displaced only vertically towards or away from the printed circuit board 5 but cannot rotate together with the rotary swivel 26.

Figure 20:
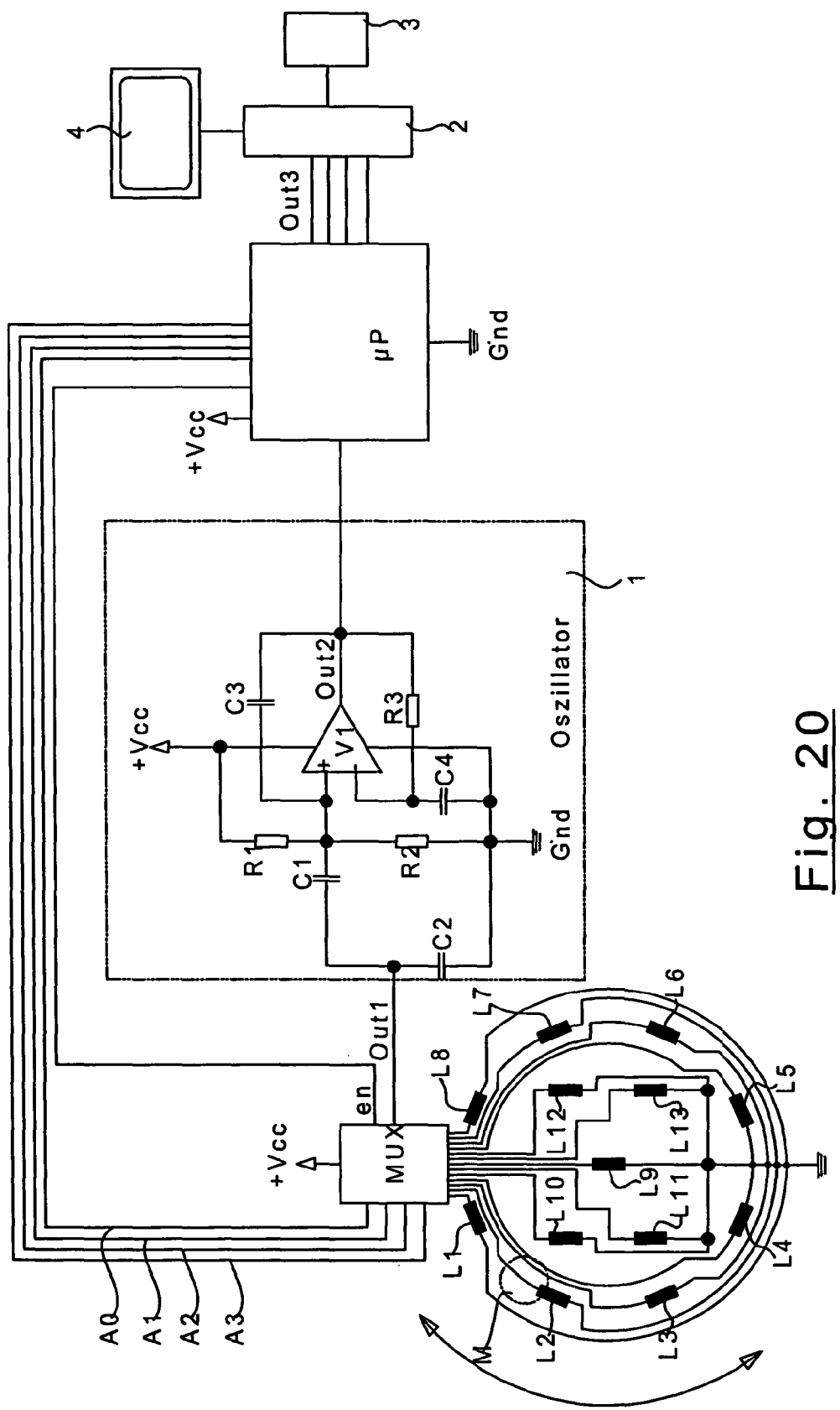
FIG. 20 is a circuit diagram of the input device according to another embodiment of the invention.

FIG. 20 shows another embodiment of the invention which differs from that in FIG. 16 in that instead of the switches S1 to S5, coils L9 to L13 are fitted in corresponding arrangement of the switches S1 to S5 which electrically are located between ground and the multiplexer. To the plungers 46, 47, 48 of FIG. 19 magnets are then fitted, and to the printed circuit board 5 in the area of the coils L9 to L13 counter magnets are fitted, with the magnet portions on the plungers and the counter magnets being magnetized such that they repel each other. By pressing down the plungers, the magnetic field on the coils L9 to L13 changes which results in a modification of the inductance value of the coils. By this, a pressing down of the plungers can be detected, with it being possible to evaluate the stroke of the pressing down and the speed, with a haptically perceivable force occurring also in this case by the magnet portions.

The microprocessor µP cyclically connects through the individual inputs of the multiplexer MUX to the output OUT1, and thus to the oscillator 1 so that all coils L1 to L13 are alternately and continuously polled.

Figure 21:
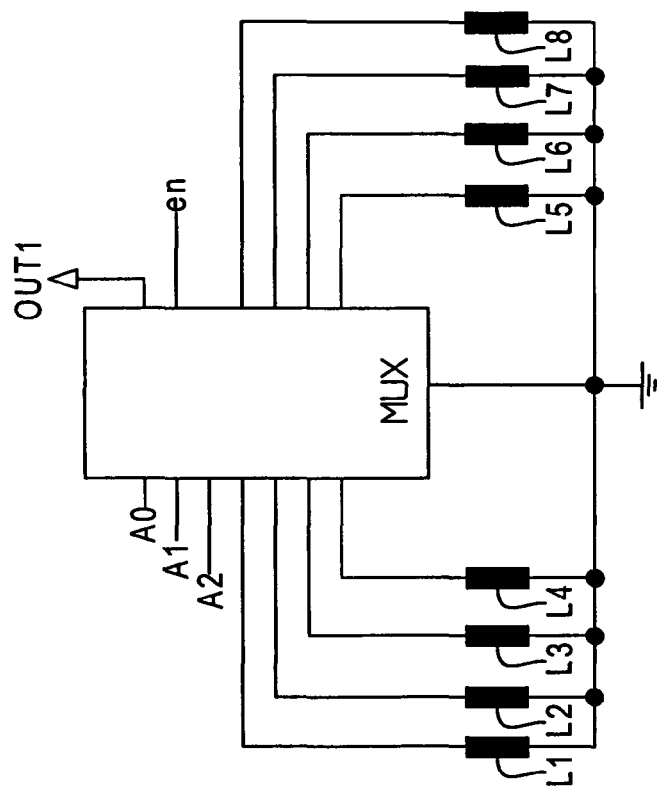
FIG. 21 is a circuit diagram of the input device according to another embodiment of the invention.

FIG. 21 shows another embodiment of the invention which differs from that in FIGS. 16 and 20 substantially by the oscillator 1. The switches S1 to S5 and the coils L9 to L13 of FIGS. 16 and 20 resp. are omitted here to simplify matters. Of course, they can be provided in the same way in the circuit of FIG. 20. The oscillator 1 is designed here in such a way that the two inputs (+) and (−) of the amplifier V1 by voltage dividers R1, R2 and R3, R4 are each on half of the supply voltage +CV. The negative input of the amplifier V1 is connected to the output OUT1 of the multiplexer MUX via a coupling capacitor C1. Moreover, the negative input of the amplifier V1 is connected to the output OUT2 of the amplifier V1 via a feedback capacitor C3. The output of the multiplexer MUX is in addition connected to ground via a capacitor C2, and via a capacitor C4 with the microprocessor µP. Via said capacitor C4 the oscillator 1 receives a start impulse from the microprocessor µP, which guarantees a safe initial oscillation, with said impulse being synchronized with respective switchover of the multiplexer MUX.

The multiplexer MUX is controlled via an Enable input (en) and address lines A0, A1, A2 in the same way as in the embodiment of FIGS. 16 and 20. Peripherals such as driver circuits, a monitor or the like are connected to the output OUT3 of the microprocessor µP in the same way as in the embodiment of FIG. 16.

The circuit of the oscillator 1 in FIG. 21 is characterized by lower power consumption and safe initial oscillation due to the impulse on the capacitor C4. It should be mentioned in passing that the amplifier V1 can be a comparator which by the external circuit and the RC elements of the coils L1 to L8 forms an oscillating circuit with the capacitor C2. Finally, it should be noted that the supply voltage CV+ of the oscillator 1 can likewise be applied by the microprocessor μP, and is thus connected by the microprocessor. In the microprocessor μP an evaluation of the oscillator frequency takes place here as well which can be carried out also not only regarding the frequency value but also regarding the change of frequency.

Figure 22:
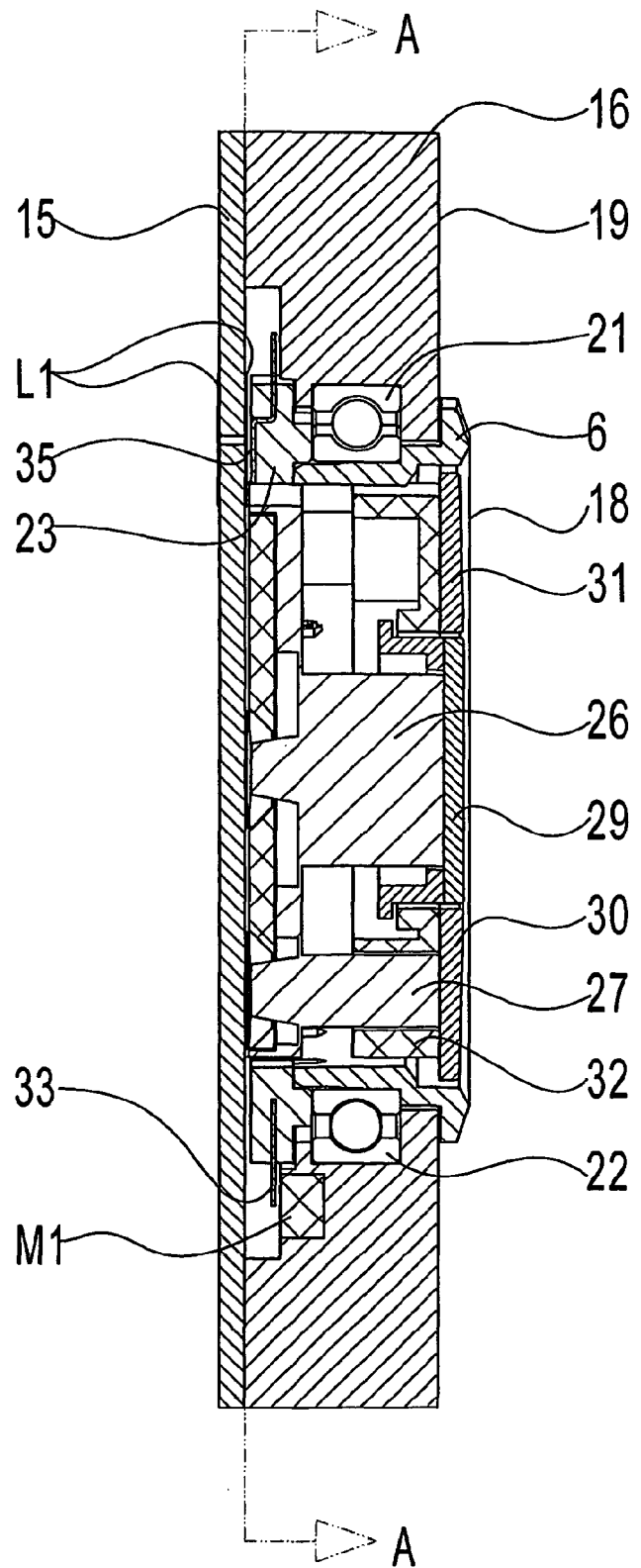
FIG. 22 is a cross-section of the input device according to the other embodiment of the invention along line B-B of FIG. 23.
Figure 23:
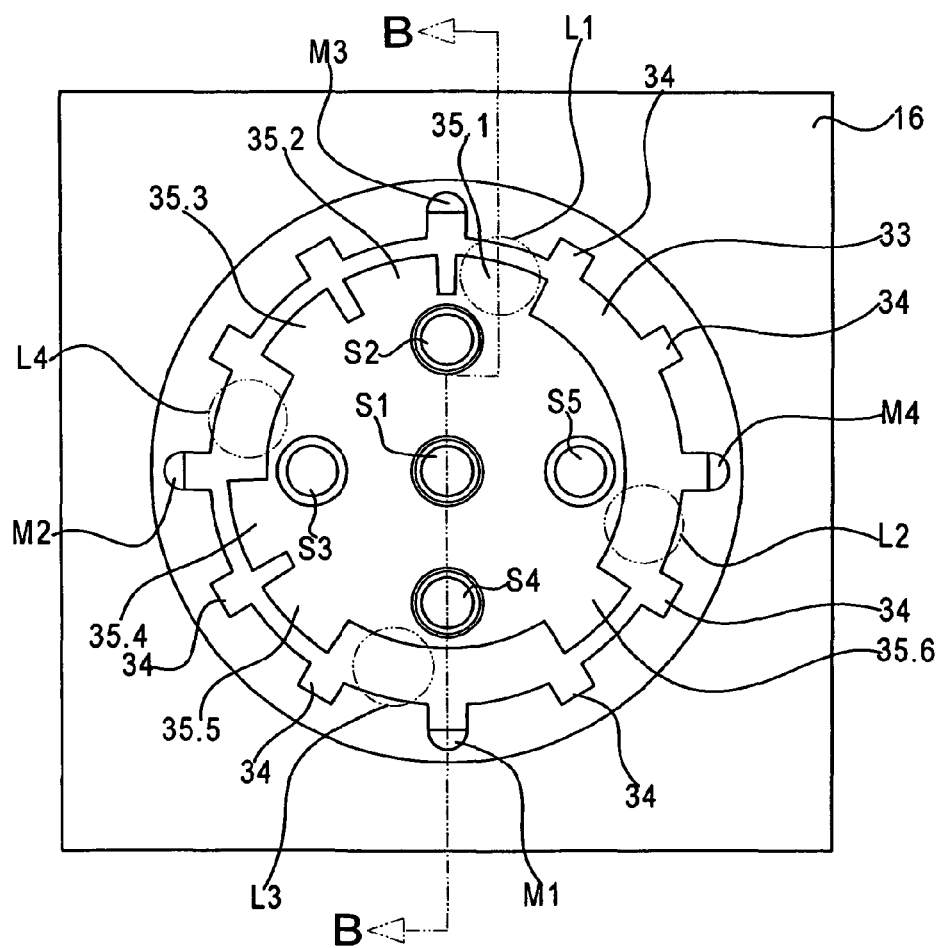
FIG. 23 is a view along line A-A of FIG. 22 of the input device.

FIGS. 22 and 23 show another embodiment of the invention where only a predetermined number of rotational positions is supposed to be detected, with twelve predefined rotational positions being detectable according to FIG. 23, and intermediate positions of the rotary swivel 26 not being intended to be detected. The predetermined rotational positions of the rotary swivel 26 are determined by a magnetic "scanning". For this purpose, four stationary magnets M1, M2, M3 and M4 are mounted in the housing 15, and a metal disc 34 rotatable together with the rotary swivel 26 made of ferromagnetic material has a number of protruding teeth 35, with their number defining the number of possible locking positions, thus twelve in the case of FIG. 23.

The metal disc 34 is fitted to the magnet supporting ring 23, which in turn is non-rotatably connected to the rotary swivel 26, and thus can be rotated via the ball bearing 21. The teeth 35 are arranged near the magnets M1 to M4 in a close distance, and in radial direction relative to the rotating axis of the rotary swivel 26 cover approx. half of the end face of the magnets M1 to M4. Moreover, an encoder disc 36 is fitted to the magnet supporting ring 23, which encoder disc 36 is rotatable together with the magnet supporting ring 23 and the rotary swivel 26, and comprises projections 36.1 to 36.6 arranged opposite to the coils L1 to L4, and thus modify their inductance value, when they are opposite to the coil and/or are not opposite to the coil. In FIG. 23 the condition is shown where the projection 36.1 covers the coil L1 whereas the projections 36.2 to 36.6 do not cover none of the other coils L2 to L4.

The metal disc 34 and the encoder disc 36 can be formed as one disc in one single piece, with the teeth 35 of the metal disc 34 and the teeth 36.1-36.6 of the encoder disc 36 being axially offset against each other in such a way that the teeth 36.1-36.6 of the encoder disc are closer to the coils L1 to L4 than the teeth 35 of the metal disc, and vice versa the teeth 35 of the metal disc are closer to the magnets M1 to M4 than the teeth 36.1-36.6 of the encoder disc. The teeth 36.1-36.6 of the encoder disc 36 are arranged such that, depending on the rotational position of the rotary swivel 26, different combinations of covering of the coils L1 to L4 by the teeth 36.1-36.6 of the encoder disc are formed so that the oscillating circuits allocated to the coils L1 to L4 have different combinations of output signals, since a coil each covered by a projection 36.1-36.6 of the encoder disc 36 and accordingly coils not covered by the encoder disc 36 produce different output signals. Depending on the number of coils and projections of the encoder disc 36, thus any number of unequivocally pre-defined rotational positions can be differentiated.

Also in this embodiment, the rotary swivel 26 has a central opening for actuating means of switches S1 to S5, which according to the embodiment of FIG. 19 are likewise formed as switch domes of known design, which can be actuated by switch plungers 27. Generally, the switches can be formed in the same way as described in the embodiments of FIGS. 19 and 20.

In the embodiment of FIGS. 22 and 23 the coils L1 to L4 are printed on both sides of the printed circuit board which increases their inductance.

The invention claimed is:

1. An input apparatus comprising:
a printed circuit board;
at least one first magnet portion stationary relative to the printed circuit board;
at least one second magnet portion movable relative to the printed circuit board; and
at least one sensor for determining the positions of the movable magnet portion;
wherein the at least one sensor is a coil applied to the printed circuit board, that the coil is associated with an oscillator the output signal of which has a frequency depending on the position of the movable second magnet portion relative to the at least one coil;
wherein the coils are printed on the printed circuit board or are applied by etching;
wherein the output signal of the oscillator is connected to a microprocessor;
wherein the coils are printed on the printed circuit board or are applied by etching; and
wherein the at least one stationary first magnet portion is applied on the side of the printed circuit board opposite the coils.

2. An input apparatus comprising:
a printed circuit board;
at least one first magnet portion stationary relative to the printed circuit board;
at least one second magnet portion movable relative to the printed circuit board; and
at least one sensor for determining the positions of the movable magnet portion;
wherein the at least one sensor is a coil applied to the printed circuit board, that the coil is associated with an oscillator the output signal of which has a frequency depending on the position of the movable second magnet portion relative to the at least one coil;
wherein the output signal of the oscillator is connected to a microprocessor; and
wherein the oscillator comprises a feedback operational amplifier as well as at least one capacitor which together with the inductance of the at least one coil forms the frequency determining LC element of the oscillator.

3. The input device according to claim 2, wherein the coils are printed on the printed circuit board or are applied by etching.

4. The input device according to claim 2, wherein several coils are selectively connectable to the oscillator via at least one multiplexer, with the at least one multiplexer being switched over periodically by the microprocessor.

5. An input apparatus comprising:
a printed circuit board;
at least one first magnet portion stationary relative to the printed circuit board;
at least one second magnet portion movable relative to the printed circuit board; and
at least one sensor for determining the positions of the movable magnet portion;
wherein the at least one sensor is a coil applied to the printed circuit board, that the coil is associated with an oscillator the output signal of which has a frequency depending on the position of the movable second magnet portion relative to the at least one coil;
wherein the output signal of the oscillator is connected to a microprocessor;

wherein several coils are selectively connectable to the oscillator via at least one multiplexer, with the at least one multiplexer being switched over periodically by the microprocessor; and wherein several coils are arranged in matrix shape, and are connected in lines and rows with inputs of the at least one multiplexer.

6. The input device according to claim 1, wherein the at least one stationary first magnet portion is a disc magnet, an annular magnet or a solenoid.

7. The input device according to claim 6, wherein several of said stationary first magnet portions spaced apart from each other are fitted on the printed circuit board.

8. The input device according to claim 1, wherein the movable second magnet portion is a disc magnet or a cylindrical magnet, and that the movable second magnet portion is located in an operating element.

9. The input device according to claim 1, wherein the movable second magnet portion is guided in a sliding block guide.

10. An input apparatus comprising:
a printed circuit board;
at least one first magnet portion stationary relative to the printed circuit board;
at least one second magnet portion movable relative to the printed circuit board; and
at least one sensor for determining the positions of the movable magnet portion;
wherein the at least one sensor is a coil applied to the printed circuit board, that the coil is associated with an oscillator the output signal of which has a frequency depending on the position of the movable second magnet portion relative to the at least one coil;
wherein the output signal of the oscillator is connected to a microprocessor; and
wherein the movable second magnet portion can be displaced along a circular path, with the sensors also being arranged along the circular path.

11. The input device according to claim 10, wherein along the circular path stationary first magnet portions are arranged, which together with the movable second magnet portion during its displacement produce a haptically perceivable magnetic force and at the same time form locking positions for displacement of the movable magnet portion.

12. The input device according to claim 10 wherein the at least one first movable magnet portion is fitted on a rotary swivel.

13. The input device according to claim 12, wherein the rotary swivel is supported in a ball bearing opposite a housing plate.

14. The input device according to claim 10, wherein electric switching contacts are applied on the printed circuit board which together with switch domes and plungers form electric switches.

15. The input device according to claim 10, wherein in addition to the coils arranged along the circular path, further coils are arranged inside the circular path, a permanent magnet is allocated to each of the additional coils and a plunger with another magnet portion is allocated to each of the additional coils, with the additional coils also being connectable to the oscillator.

16. The input device according to claim 10, wherein the oscillator comprises an operational amplifier feedback via a capacitor, and both inputs of the operational amplifier by voltage dividers are on half of the operating voltage of the oscillator, and one of the inputs of the operational amplifier can be selectively connected to one of the coils via a coupling capacitor.

17. The input device according to claim 16, wherein a start impulse can be fed by a microprocessor to one of the inputs of the operational amplifier via another capacitor.

18. The input device according to claim 16, wherein the operating voltage of the oscillator can be switched on and off by a microprocessor.

19. The input device according to claim 10, wherein the coils can be connected selectively to the oscillator via at least one multiplexer, with the at least one multiplexer being periodically switched over by the microprocessor.

* * * * *